(12) United States Patent
Wang et al.

(10) Patent No.: US 8,033,739 B2
(45) Date of Patent: Oct. 11, 2011

(54) OPTICAL CONNECTOR WITH IMPROVED RETAINING ELEMENT

(75) Inventors: Xin-Wen Wang, Kunshan (CN); Zhong-Hua Yao, Kunshan (CN); Qi-Sheng Zheng, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 109 days.

(21) Appl. No.: 12/291,415

(22) Filed: Nov. 10, 2008

(65) Prior Publication Data

US 2010/0119196 A1 May 13, 2010

(30) Foreign Application Priority Data

Nov. 9, 2007 (CN) .................. 2007 2 0042125 U

(51) Int. Cl.
*G02B 6/36* (2006.01)
*G02B 6/38* (2006.01)
(52) U.S. Cl. ............... 385/53; 385/56; 385/88; 385/92
(58) Field of Classification Search .................. 385/53, 385/56
See application file for complete search history.

(56) References Cited

U.S. PATENT DOCUMENTS

| | | | |
|---|---|---|---|
| 4,993,803 A * | 2/1991 | Suverison et al. ............... 385/88 |
| 6,357,931 B1 * | 3/2002 | Shirakawa et al. ............. 385/75 |
| 6,481,902 B2 | 11/2002 | Takaoka et al. | |
| 6,558,045 B2 * | 5/2003 | Yamaguchi ..................... 385/75 |
| 6,709,166 B1 * | 3/2004 | Miyachi et al. ................. 385/56 |
| 6,869,311 B2 | 3/2005 | Somura | |
| 6,939,054 B2 * | 9/2005 | Nakura et al. .................. 385/53 |
| 7,186,034 B2 | 3/2007 | Hu et al. | |
| 2004/0028315 A1 * | 2/2004 | Weigel ............................ 385/14 |
| 2008/0232741 A1 * | 9/2008 | Grzegorzewska et al. ...... 385/55 |
| 2010/0046891 A1 * | 2/2010 | Sabo ............................... 385/74 |

* cited by examiner

*Primary Examiner* — Uyen-Chau N Le
*Assistant Examiner* — Chris H Chu
(74) *Attorney, Agent, or Firm* — Wei Te Chung; Andrew C. Cheng; Ming Chieh Chang

(57) ABSTRACT

An optical connector (1) includes an housing (2) having a front wall, an upper wall, a bottom wall, a pair of side walls and a receiving cavity (215) formed therebetween for receiving a mating plug; and an optical member (3) having an optical portion (31) for receiving or emitting light and a number of contacts connected to the optical portion; an insulative cover member (25) attached to the housing and defining a first portion (251) covering an upper portion of the housing and a second portion (258) enclosing a rear portion of the housing, the first portion defining a cutout (252) extending therethrough along an up-to-down direction; a metal lock member (6) defining a lateral arm (61) being retained in the cutout and a locking portion (62) extending downward from the lateral arm and projecting through the housing to be soldered to a printed circuit board, the locking portion locks with the housing.

15 Claims, 11 Drawing Sheets

OPTICAL CONNECTOR WITH IMPROVED RETAINING ELEMENT

BACKGROUND OF THE INVENTION

1. Field of the Invention

The present invention generally relates to an optical connector and more particularly to an optical connector with improved retaining element to be mounted onto a printed circuit board.

2. Description of Related Art

A conventional optical connector which is mounted on a printed circuit board typically comprises an insulative housing having an insertion hole for receiving an optical signal transmission plug, and an optical element which may be a photoelectric converter retained in a rear portion of the housing for transferring and receiving an optical signal to/from the optical signal transmission plug. The optical element defines a plurality of soldering legs for being soldering onto the printed circuit board. In order to retaining the optical connector reliably to the printed circuit board, the optical connector is designed to include an metal shell covering the housing, the shell is provided with a number of retaining legs fixed on the printed circuit board to attach the optical connector to the printed circuit board. However, the metal shell needs to be made large in dimension to enclose the housing, therefore increasing the overall cost of the optical connector.

It is thus desired to provide an optical connector having an improved retaining portion.

SUMMARY OF THE INVENTION

According to one aspect of the present invention, an optical connector to be mounted on a printed circuit board, comprises: an insulative housing having a front wall, an upper wall, a bottom wall, a pair of side walls, a receiving cavity formed therebetween for receiving a mating plug, the front wall defining a front mating face, the receiving cavity recessed rearward from the front mating face; and an optical member having an optical portion for receiving or emitting light and a plurality of contacts connected to the optical portion; an insulative cover member attached to the housing and defining a first portion covering an upper portion of the housing and a second portion enclosing a rear portion of the housing, the first portion defining a cutout extending therethrough along an up-to-down direction and a pair of supporting arms; a metal lock member defining a lateral arm being retained in the cutout and supported by the supporting arms along the up-to-down direction and a locking portion extending downward from the lateral arm and projecting through the housing to be soldered to the printed circuit board, the locking portion locking with the housing.

According to another aspect of the present invention, an optical connector to be mounted on a printed circuit board, comprises: an insulative housing having a front wall, an upper wall, a bottom wall, a pair of side walls, a receiving cavity formed therebetween for receiving a mating plug, the front wall defining a front mating face, the receiving cavity recessed rearward from the front mating face; an optical member having an optical portion for receiving or emitting light and a plurality of contacts connected to the optical portion; a cover member attached to the housing and defining a first portion covering an upper portion of the housing and a second portion enclosing a rear portion of the housing; and a metal lock member defining a lateral arm sandwiched between the first portion and the housing along a height direction of the housing and a locking portion extending through the housing to be soldered to the printed circuit board and locking with the housing.

Other objects, advantages and novel features of the present invention will become more apparent from the following detailed description of the present embodiment when taken in conjunction with the accompanying drawings.

DETAILED DESCRIPTION OF THE INVENTION

Figure 1:
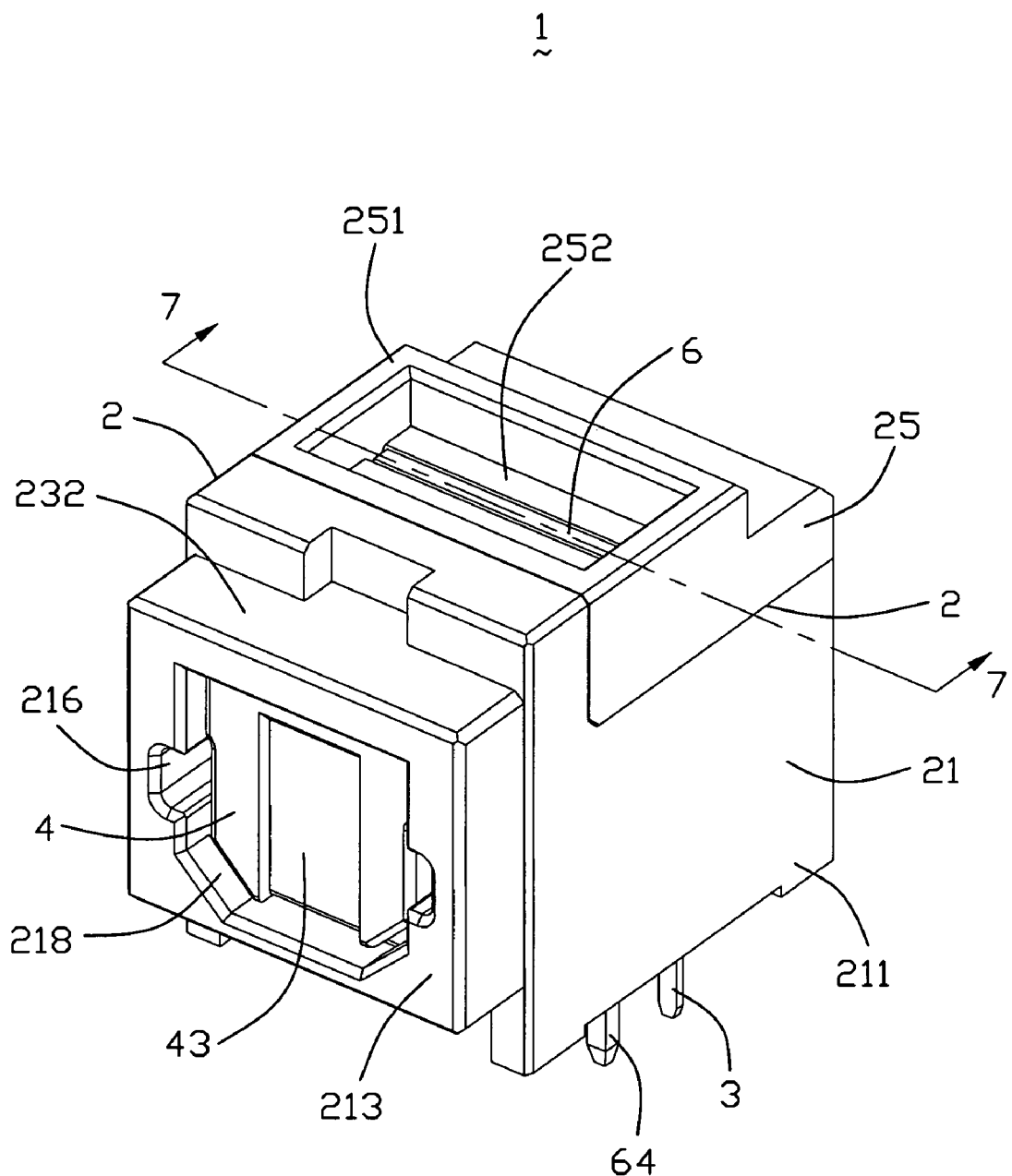
FIG. 1 is an assembled perspective view of an optical connector according to a first embodiment of the present invention.
Figure 2:
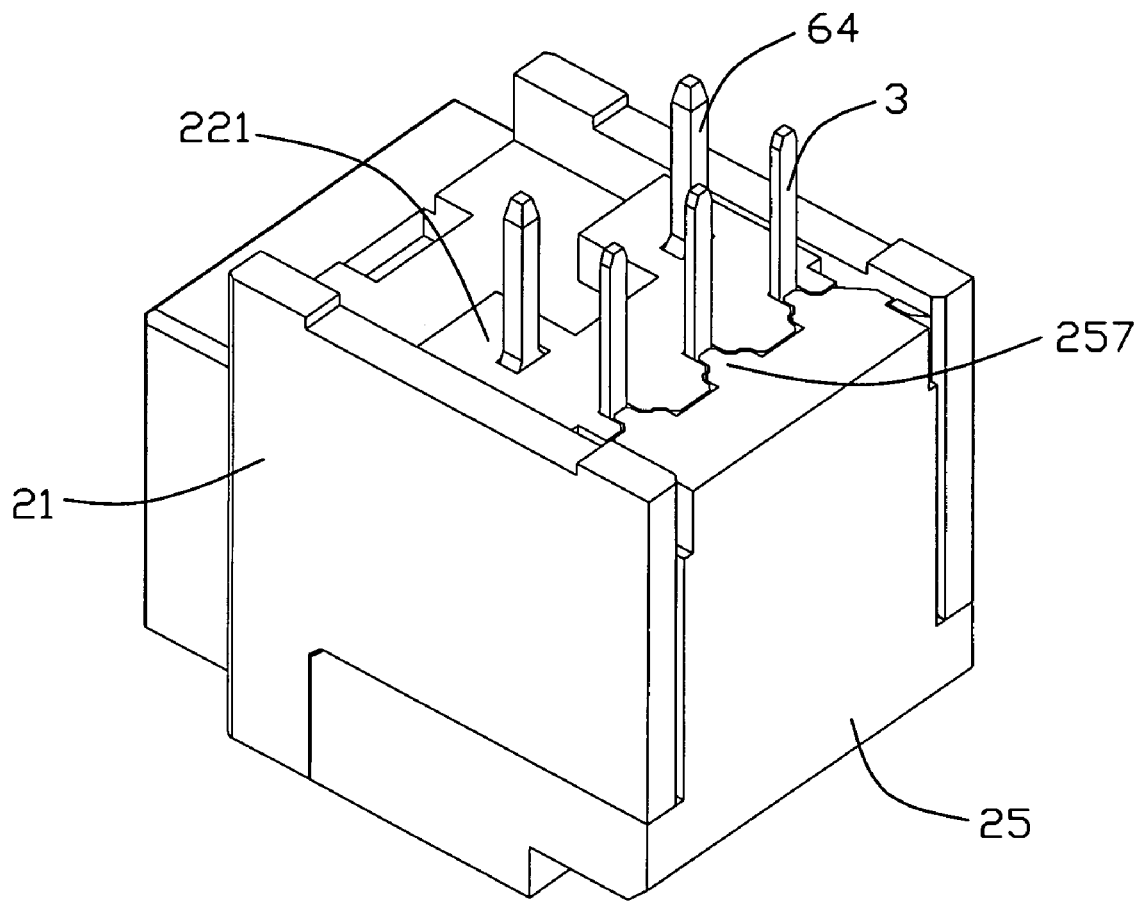
FIG. 2 is a view similar to FIG. 1, while taken from a different aspect.
Figure 3:
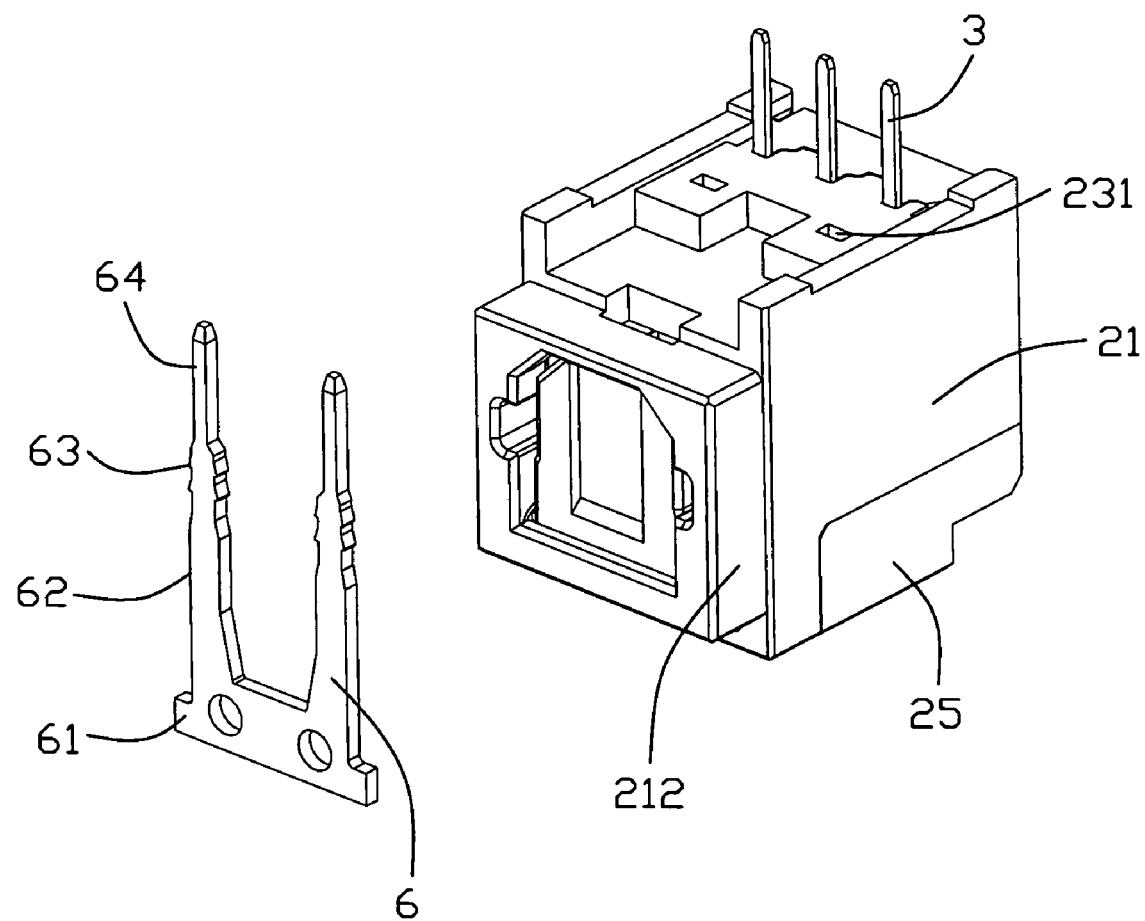
FIG. 3 is a partly exploded perspective view of the optical connector.
Figure 4:
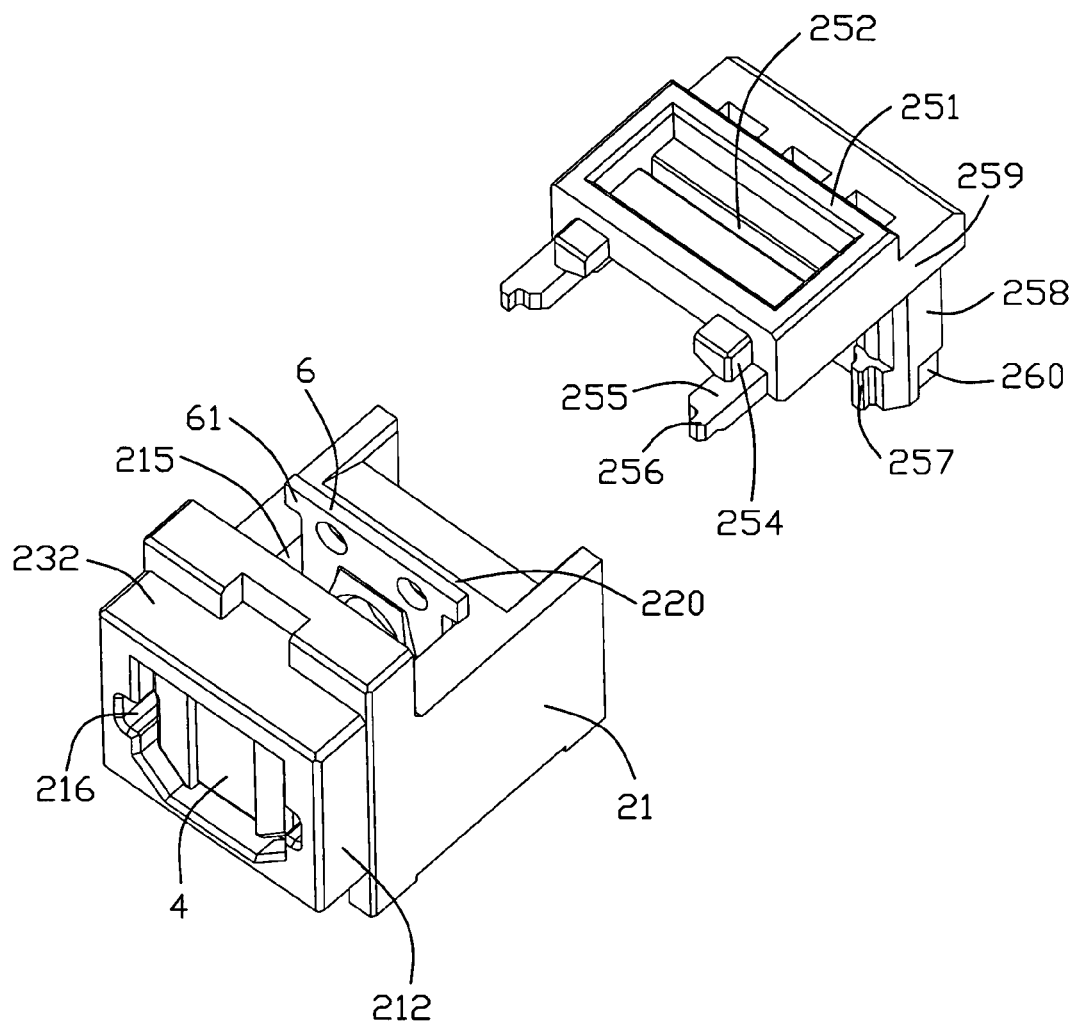
FIG. 4 is another partly exploded perspective view of the optical connector.
Figure 5:
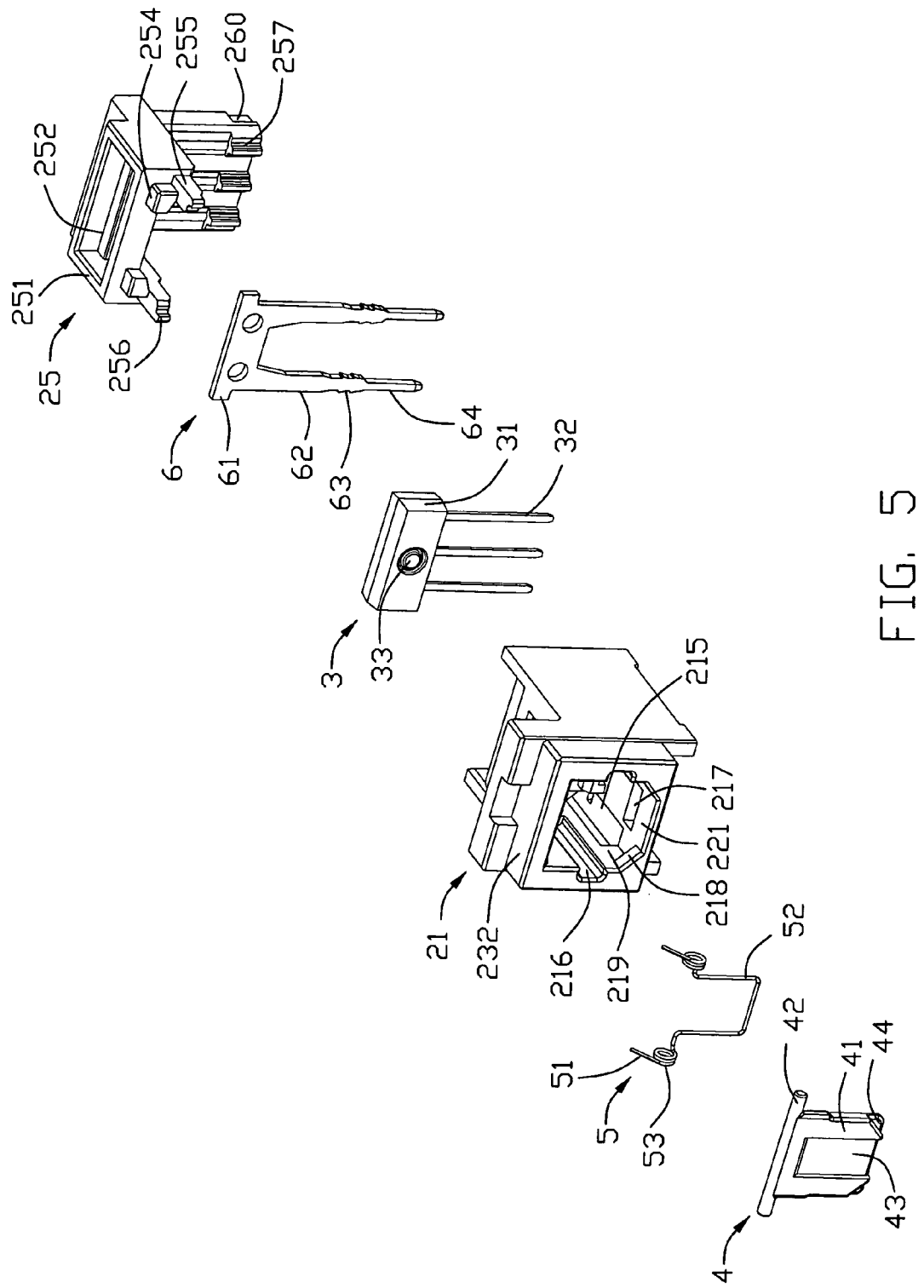
FIG. 5 is an exploded perspective view of the optical connector.
Figure 6:
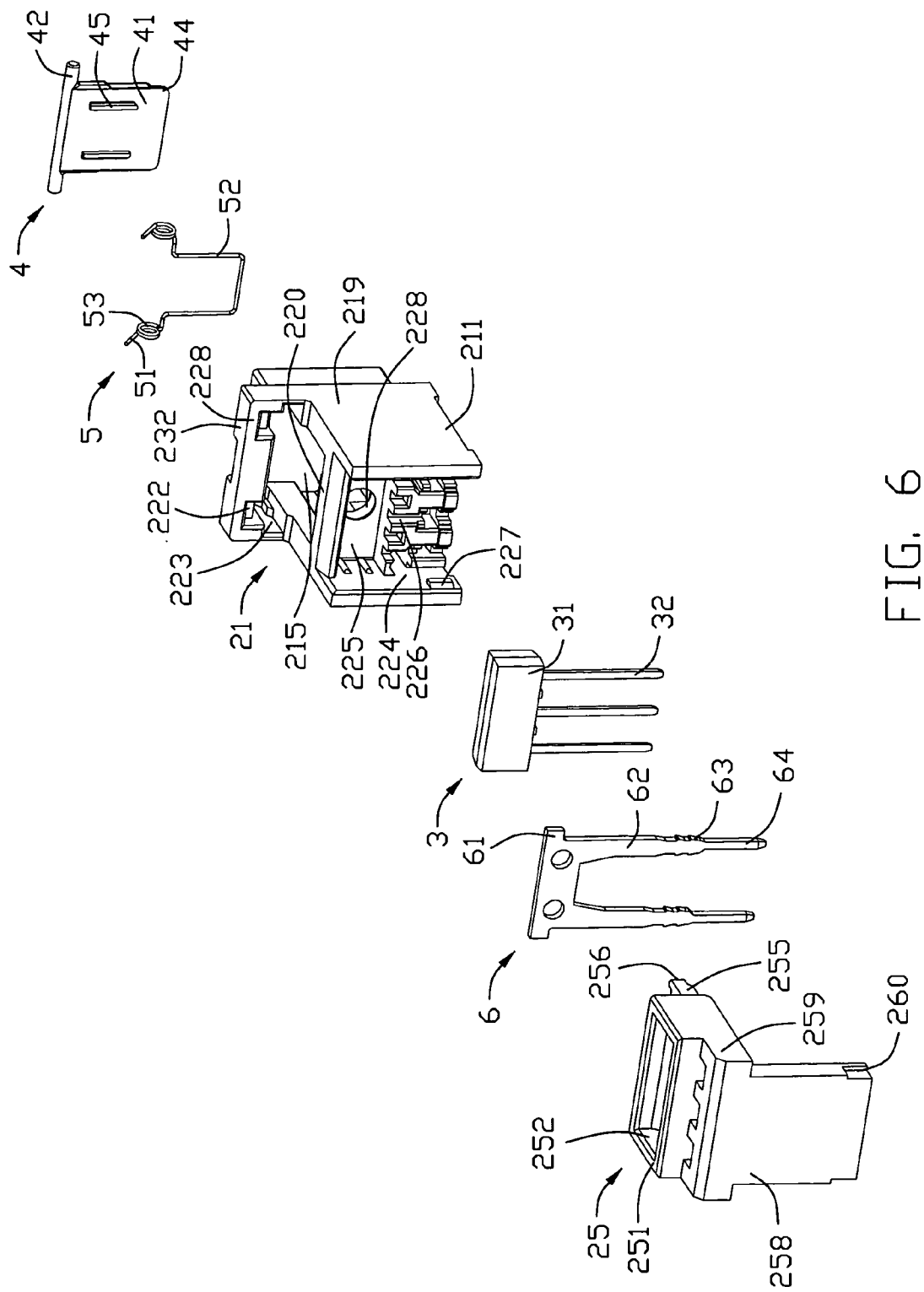
FIG. 6 is a view similar to FIG. 5, while taken from a different aspect.

Reference will now be made to the drawing figures to describe the preferred embodiment of the present invention in detail.

Referring to FIGS. 1-8, an optical connector 1 to be mounted to a printed circuit board (not shown) according to the preferred embodiment of the present invention includes an insulative housing 2, an optical member 3 received in the insulative housing 2 to be mounted to the printed circuit board, a door 4 pivotably mounted on a front end of the insulative housing 2, an elastic spring 5 biasing against the door 4 and make the door 4 have a tendency to move forward, and a metal lock member 6 fixed on the insulative housing 2 to retain the optical connector 1 to the printed circuit board.

The housing 2 has a front wall 213, an upper wall 232, a bottom wall 221, a pair of side walls 219, a receiving cavity 215 formed therebetween for receiving a mating optical plug. The door 4 rotates inward or outward to open or close the receiving cavity 215 upon an insertion or retraction of the mating plug. The front wall 213 defines a front mating face, the receiving cavity 215 is recessed rearward from the front mating face and extends upwardly through the upper wall 232. The housing 2 further comprises a rear wall 220 connecting with the side walls 219 and the bottom wall 221, the side walls 219 extend rearward beyond the rear wall 220 to form a receiving space 224 between the side walls 219 and the rear wall 220. The rear wall 220 defines a retaining cavity 225 communicating with the receiving space 224 and a through hole 228 communicating with both the receiving cavity 215 and retaining cavity 225.

The optical member 3 having an optical portion 31 for receiving or emitting light and a plurality of contacts 32 connected to the optical portion 31. The optical portion 31 is retained in the retaining cavity 225 and exposed to the receiving cavity 215 via the through hole 228 to mate with the mating plug. The rear wall 220 is formed with a plurality of slits 226 communicating with the retaining cavity 225 and extending downwardly through the bottom wall 221, the contacts 32 are fixed in the slits 226 respectively and soldered to the printed circuit board. The optical portion 31 defines a light receiving or emitting portion 33 on a substantially middle portion thereof to be aligned with the through hole 228 along a front-to-rear direction of the housing 2.

The optical connector 1 is provided with an insulative cover 25 including a lateral portion 251 supported by the side walls 219 to enclose the receiving cavity 215 along a height direction of the housing 2 and an vertical portion 258 extending downwardly from a rear side of the lateral portion 251 to be retained in the receiving space 224. The lateral portion 251 covers an upper portion of the housing 2 and the vertical portion 258 encloses a rear portion of the housing 2. The side walls 219 each is formed with a projection 227 extending inwardly into the receiving space 224. The vertical portion 258 is provided with a pair of tabs 260 on lower sides thereof to be retained by the projections 227 along the front-to-rear direction. A plurality of protrusions 257 are formed on an inner side of the vertical portion 258 to extend into the slits 226 and abut against the contacts 32 respectively. The lateral portion 251 is formed with a cutout 252 extending therethrough along an up-to-down direction and a pair of supporting arms 261 on opposite sides of the cutout 252.

Figure 7:
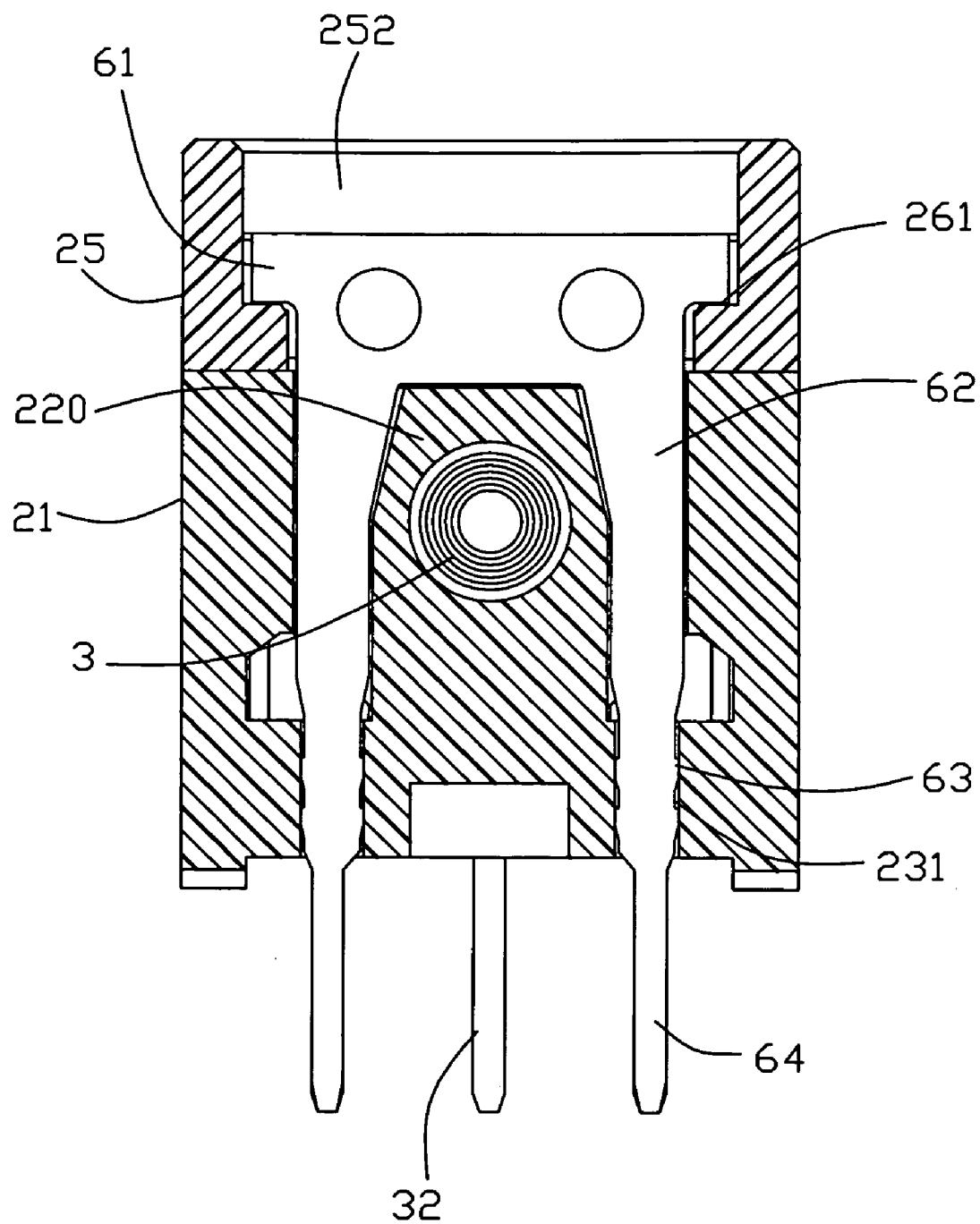
FIG. 7 is a cross-sectional view of the optical connector taken along line 7-7 of FIG. 1.
Figure 8:
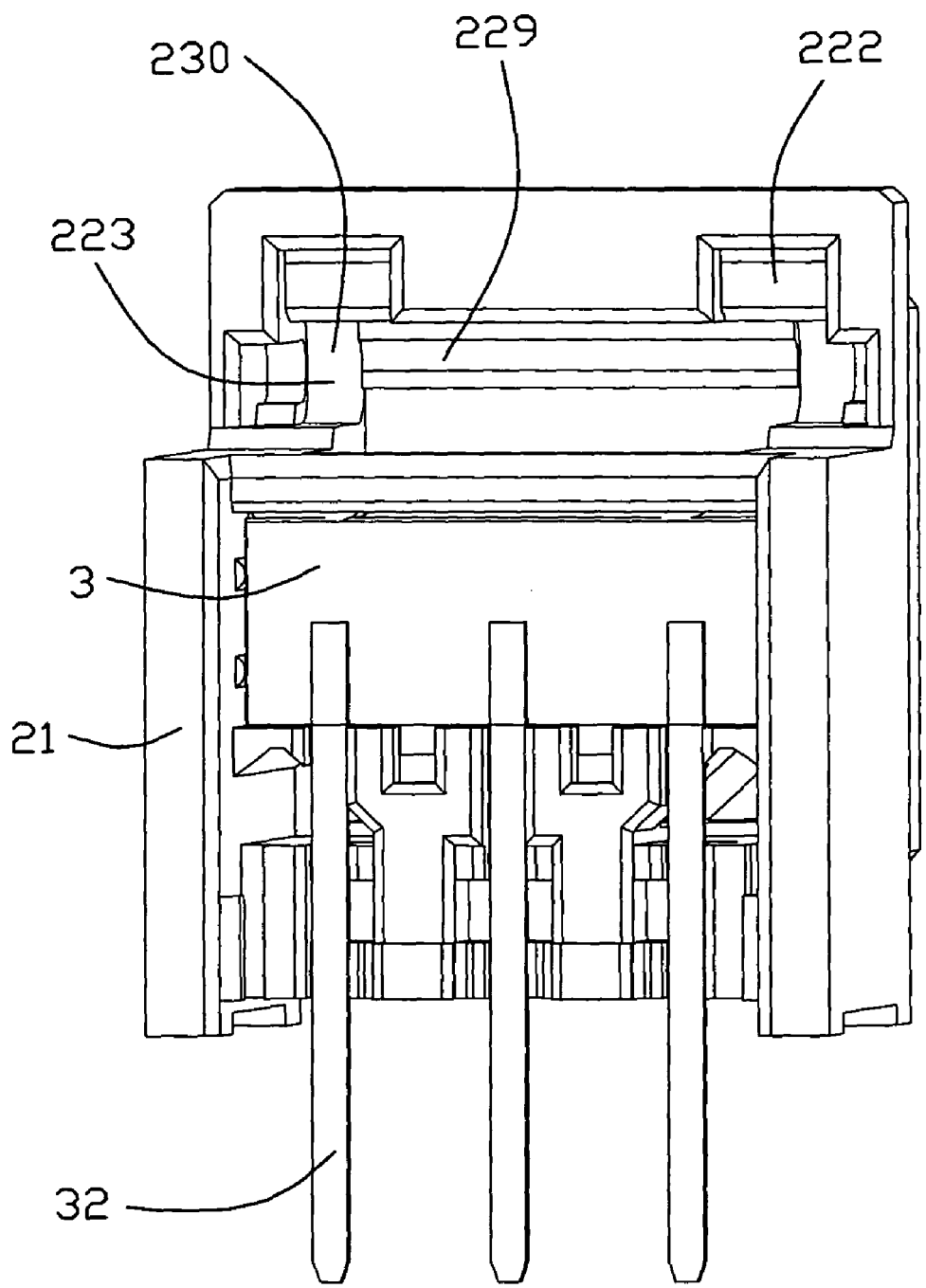
FIG. 8 is an assemble perspective view of the insulative housing and an optical element of the optical connector.

The metal lock member 6 defining a lateral arm 61 retained in the cutout 252 and supported by the supporting arms 261 and a locking portion 62 extending downward from the lateral arm 61 and projecting through the bottom wall 221 to be soldered to the printed circuit board. The locking portion 62 defines a pair of retaining legs 64 with barbs 63 formed thereon, The bottom wall 221 defines a pair of retaining holes 231 locking with the barbs 63. Referring to FIG. 7, the retaining legs 64 are spaced from each other and are located on a front side of the through hole 228 and the optical member 3 to be positioned on opposite sides of the through hole 228 and the light receiving portion 33. The retaining legs 64 are received in the receiving cavity 215 to abut against a front side face of the rear wall 220 and project downwardly through the bottom wall 221.

The door 4 defines a main portion 41 for substantially close the receiving cavity 215 and a shaft 42 around which the door 4 rotates. The main portion 41 is provided an elongated groove 43 for locking with the mating plug and a pair of corner portions 44 on a lower side of the main portion 41. The front wall 213 defines a triangular restricting portion 218 to abut against the corner portion 44, thus preventing the door 4 from moving outside the front wall 213.

The elastic spring 5 is a torsion coil spring and includes a pair of opposite circles 53 attached to the shaft 42, a middle U-shaped abutting portion 52 connecting with the circles 53, and a pair of rear ends 51 for abutting against an inner side of the upper wall 232. The U-shaped abutting portion 52 biases the door 4 towards a direction of closing the door 4. In use, the door 4 is opened by an insertion of the mating plug. When the mating plug is extracted after use, the abutting portion 52 contacts the rear surface of the door 4 to make the door 4 turns about the shaft 42 under the returning force of the U-shaped abutting portion 52. Thus, the receiving cavity 215 is automatically closed by the door 4. The door 4 can be automatically opened/closed in accordance with the insertion/extraction of the mating plug.

The upper wall 232 includes a pair of receiving grooves 223 for accommodating the shaft 42 together with the circles 53, the lateral portion 251 has a pair of posts 256 extending into the receiving grooves 223 to bias against the shaft 42. The shaft 42 is sandwiched between the front wall 213 and the corresponding post 256. A pair of guiding grooves 216 are recessed inwardly from the front mating face to guide the mating plug into the receiving cavity 215. The grooves 216 are communicating with the receiving cavity 215. A pair of locking grooves 222 are provided on a rear side of the upper wall 232, the lateral portion 251 includes a pair of locking tabs 254 protruding forwardly to lock with the locking groove 222 respectively. The bottom wall 221 defines a concave 217 to lock with mating plug.

Figure 9:
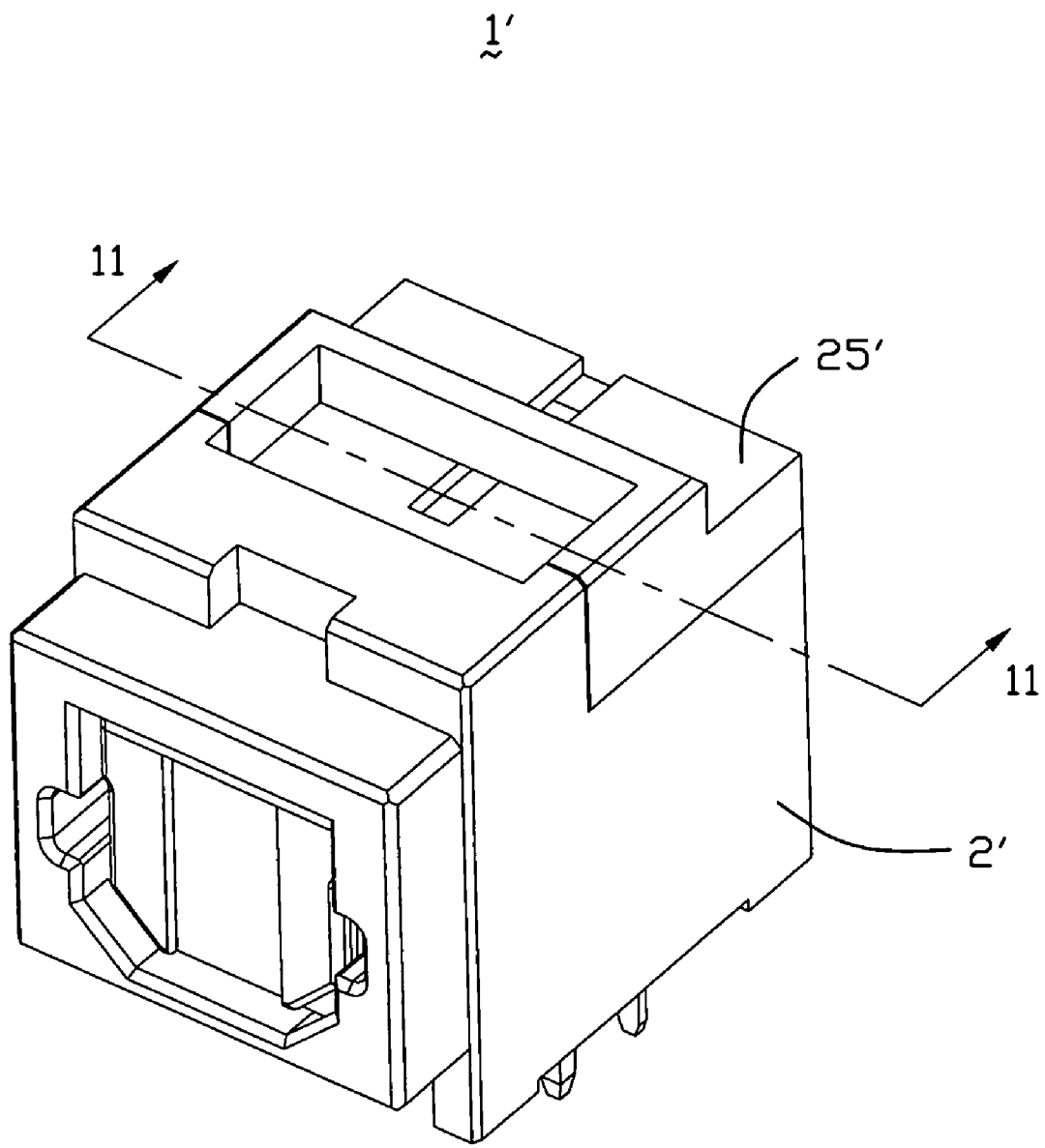
FIG. 9 is an assembled perspective view of an optical connector according to a second embodiment of the present invention.
Figure 10:
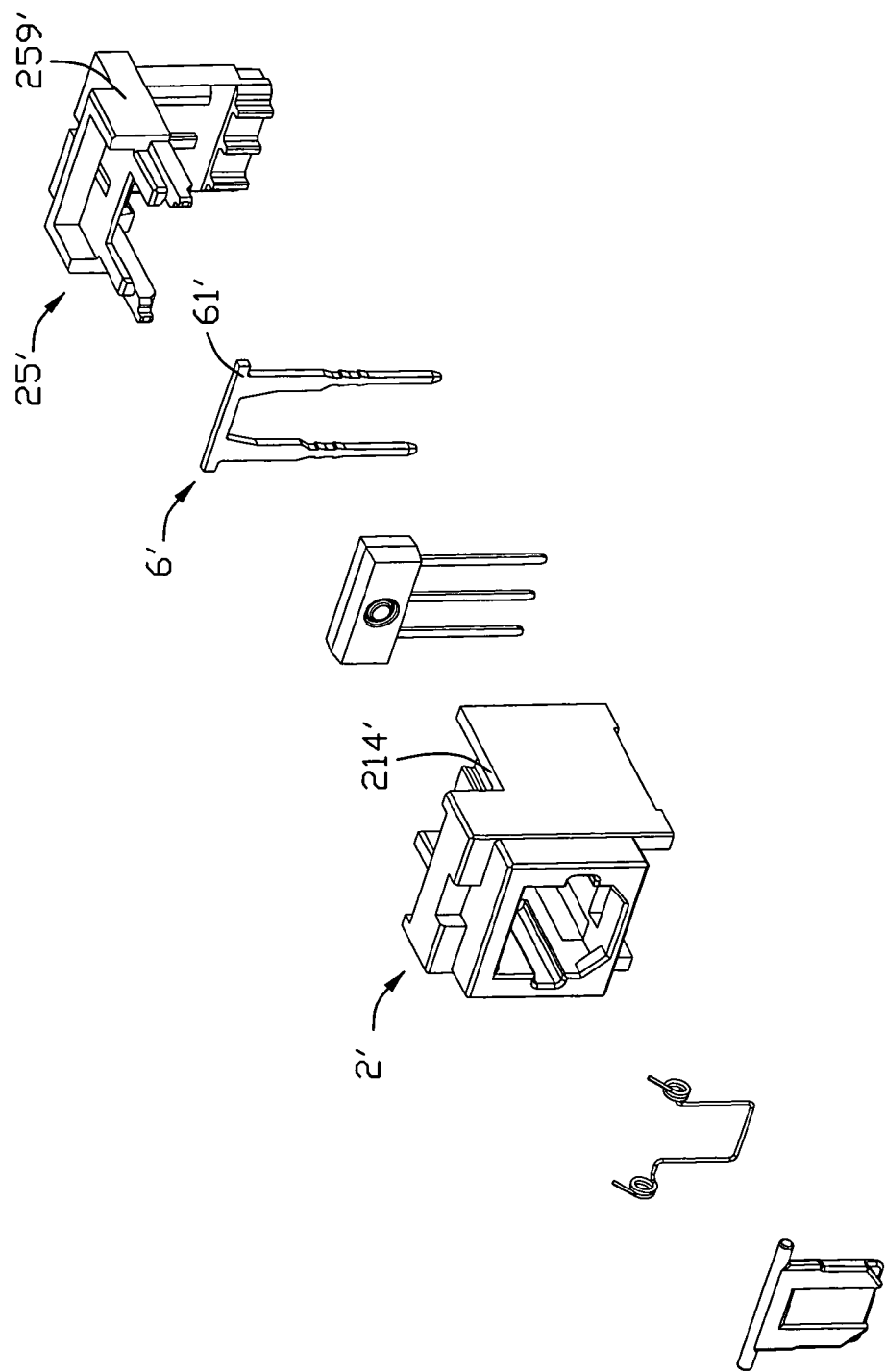
FIG. 10 is an exploded perspective view of the optical connector shown in FIG. 9.
Figure 11:
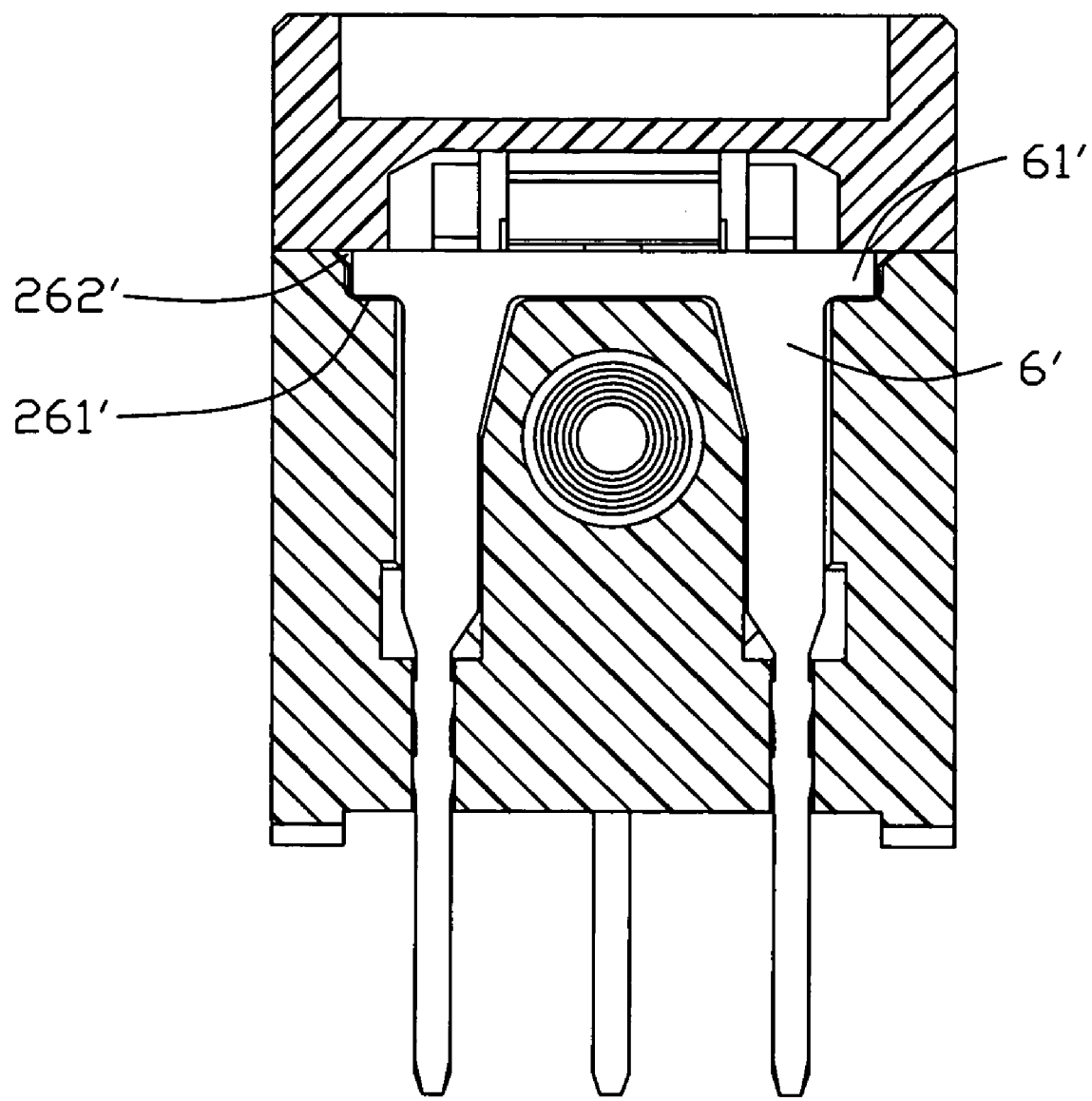
FIG. 11 is a cross-sectional view of the optical connector taken along line 11-11 of FIG. 9.

As shown in FIGS. 9-11, a second embodiment of the optical connector 1' is similar to the first embodiment shown in FIGS. 1-8, and differs in that, the cutout 262' and the supporting arms 261' are formed on upper and inner sides of the side walls 214' of the housing 2', the lateral arm 61' of the metal lock member 6' is retained in the cutout 262' and supported by the supporting arms 261', in this way, the lateral arm 61' is sandwiched between the insulative housing 2' and the insulative cover 25'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An optical connector to be mounted on a printed circuit board, comprising:
    an insulative housing having a front wall, an upper wall, a bottom wall, a pair of side walls and a receiving cavity formed therebetween for receiving a mating plug, the front wall defining a front mating face, the receiving cavity recessed rearward from the front mating face and extending through insulative housing along an up-to-down direction;
    an optical member having an optical portion for receiving or emitting light and a plurality of contacts connected to the optical portion;
    an insulative cover member attached to the housing and defining a first portion covering an upper portion of the housing and a second portion enclosing a rear portion of the housing, the first portion defining a cutout extending therethrough along an the up-to-down direction and a pair of supporting arms, the insulative cover member is of a right angle shape, the first portion is supported by upper sides of the side walls; and
    a metal lock member defining a lateral arm being retained in the cutout and supported by the supporting arms along the up-to-down direction and a locking portion extending downward from the lateral arm and projecting through the housing to be soldered to the printed circuit board, the locking portion locking with the housing, the metal lock member retains the insulative housing and the insulative cover member together, the metal lock member is located in front of the optical member and is received in the receiving cavity, the insulative cover member and the metal lock member commonly seal an upper portion of the receiving cavity.

2. The optical connector as claimed in claim 1, wherein the housing further comprises a rear wall connecting with the side walls and the bottom wall, the side walls extend rearward beyond the rear wall to form a receiving space between the side walls and the rear wall, the receiving space extends through the housing along the up-to-down direction and extends rearwardly through the housing.

3. The optical connector as claimed in claim 2, wherein the first portion is supported by upper sides of the side walls and the second portion is retained in the receiving space and sandwiched between the side walls.

4. The optical connector as claimed in claim 2, wherein the rear wall defines a retaining cavity on a rear side thereof to communicate with the receiving space and a through hole communicating with both the receiving cavity and retaining cavity, the optical portion is fixed in the retaining cavity and exposed to the receiving cavity via the through hole, the optical member is sandwiched between the rear wall and the second portion along a front-to-rear direction.

5. The optical connector as claimed in claim 4, wherein the locking portion defines a pair of retaining legs being spaced from each other, the retaining legs abut against a front side of the rear wall and is received in the receiving cavity.

6. The optical connector as claimed in claim 5, wherein the retaining legs are located on a front side of the through hole and positioned on opposite sides of the through hole.

7. The optical connector as claimed in claim 2, wherein the locking portion defines a pair of retaining legs with barbs formed thereon, the receiving cavity includes a pair of retaining holes extending downwardly through the bottom wall to lock with the barbs.

8. The optical connector as claimed in claim 1, further comprising a door pivotably mounted on the housing to open or close the receiving cavity along an insertion of the mating plug and an elastic spring abutting against a rear side of the door, the door including a shaft around which the door rotates, the first portion having a pair of posts extending forwardly to bias against the shaft, the shaft being sandwiched between the front wall and the corresponding post.

9. An optical connector comprising:
an insulative housing defining a receiving cavity for receiving a plug;
an optical member located behind the receiving cavity;
a metal lock member assembled to the housing along an up to down direction and located in front of the optical member, the metal lock member having a locking portion downwardly extending out of the insulative housing to be soldered to a printed circuit board; and
an insulative cover assembled to the housing with thereof an upper section to cover the upper portion of the insulative housing, and a vertical section to cover a rear portion of the insulative housing;
wherein an optical member has a light receiving or emitting portion forwardly exposed to the receiving cavity, the locking portion is received in a rear side of the receiving cavity and has a pair of retaining legs located at two sides of the light receiving or emitting portion along a transverse direction perpendicular to the up to down direction.

10. The optical connector as claimed in claim 9, wherein the metal lock portion has a lateral arm positioned at an upper side of the receiving cavity, and the retaining legs downwardly extend from two sides of the lateral arm and extend through a bottom wall of the insulative housing to engage with the bottom wall via a plurality of barbs at two sides thereof.

11. The optical connector as claimed in claim 10, wherein the lateral arm is pressed by the upper section to be sandwiched between the insulative cover and the insulative housing along the up to down direction, and the cover is configured to only allow said lock member to be assembled to the housing before said insulative cover is assembled to the insulative housing.

12. The optical connector as claimed in claim 11, wherein said insulative cover is configured to be allowed to be assembled to the housing only in a forward direction from a rear side of the insulative housing.

13. The optical connector as claimed in claim 9, wherein the insulative housing has a rear wall at a rear side of the receiving cavity, the retaining legs abut against a front side of the rear wall.

14. The optical connector as claimed in claim 9, further comprising a door pivotably mounted on the insulative housing to open or close the receiving cavity along an insertion direction of a mating plug, and an elastic spring abutting against a rear side of the door.

15. An optical connector comprising:
an insulative housing defining a receiving cavity for receiving a plug;
an optical member located behind the receiving cavity;
a metal lock member assembled to the housing along an up to down direction and located in front of the optical member, the metal lock member having a locking portion downwardly extending out of the insulative housing to be soldered to a printed circuit board; and
an insulative cover assembled to the housing with thereof an upper section to cover the upper portion of the insulative housing, and a vertical section to cover a rear portion of the insulative housing;
further comprising a door pivotably mounted on the insulative housing to open or close the receiving cavity along an insertion direction of a mating plug, and an elastic spring abutting against a rear side of the door;
wherein the insulative housing has an upper wall which is formed with a pair of receiving grooves, the door has a shaft received in the receiving grooves, and the upper section has a pair of posts extending forwardly into the receiving grooves to bias against the shaft for sandwiching the shaft between the front wall and the corresponding post.

* * * * *